United States Patent
Tsuchido

(10) Patent No.: US 7,745,979 B2
(45) Date of Patent: Jun. 29, 2010

(54) PIEZOELECTRIC DEVICE

(75) Inventor: Kenji Tsuchido, Minowa-machi (JP)

(73) Assignee: Seiko Epson Corporation, Tokyo (JP)

( * ) Notice: Subject to any disclaimer, the term of this patent is extended or adjusted under 35 U.S.C. 154(b) by 163 days.

(21) Appl. No.: 12/063,213

(22) PCT Filed: Aug. 10, 2006

(86) PCT No.: PCT/JP2006/315825

§ 371 (c)(1),
(2), (4) Date: Feb. 7, 2008

(87) PCT Pub. No.: WO2007/023685

PCT Pub. Date: Mar. 1, 2007

(65) Prior Publication Data

US 2009/0108709 A1    Apr. 30, 2009

(30) Foreign Application Priority Data

Aug. 22, 2005  (JP) ............................. 2005-239933

(51) Int. Cl.
*H01L 41/047* (2006.01)
(52) U.S. Cl. .................................... 310/365; 310/320
(58) Field of Classification Search ................ 310/320, 310/348, 365, 366, 368
See application file for complete search history.

(56) References Cited

U.S. PATENT DOCUMENTS 6,232,699 B1 * 5/2001 Wajima ...................... 310/320

7,012,355 B2 * 3/2006 Oda et al. .................... 310/348
2006/0244346 A1 * 11/2006 Iwata ......................... 310/368

FOREIGN PATENT DOCUMENTS

| JP | A-53-042585 | 4/1978 |
|---|---|---|
| JP | A-57-125510 | 8/1982 |
| JP | A-61-050413 | 3/1986 |
| JP | A-02-298110 | 12/1990 |
| JP | A-05-183375 | 7/1993 |
| JP | A-2001-345656 | 12/2001 |
| JP | A-2004-328442 | 11/2004 |

* cited by examiner

*Primary Examiner*—Walter Benson
*Assistant Examiner*—Derek J Rosenau
(74) *Attorney, Agent, or Firm*—Oliff & Berridge, PLC

(57) ABSTRACT

A piezoelectric device including: a piezoelectric element having, on a surface of a piezoelectric body, an exciting electrode and a drawing electrode that is electrically coupled to the exciting electrode and draws an electrode to an external section, and a substrate bonded to the drawing electrode with a metallic brazing material, in that: the piezoelectric element contains a connecting electrode connecting the exciting electrode with the drawing electrode; and the connecting electrode and/or the exciting electrode contains an underlying layer provided on the surface of the piezoelectric body and a surface layer section provided on a surface of this underlying layer, wherein: the underlying layer is provided using the metallic brazing material and a metallic material of adverse wettability; and a portion of the surface layer section is removed in a manner that the exciting electrode and the drawing electrode are separated.

7 Claims, 6 Drawing Sheets

PIEZOELECTRIC DEVICE

BACKGROUND

The present disclosure relates to a piezoelectric device equipped with a drawing electrode electrically coupled to an exciting electrode on a piezoelectric element and with a substrate bonded to this drawing electrode with a metallic brazing material.

FIG. 7 is a schematic sectional diagram of an existing piezoelectric device 1 (see, e.g., Unexamined Patent Publication No. 2004-328442).

This piezoelectric device is composed of three stacked crystal substrates 2, 3, 4.

The crystal substrate 2 is disposed between the crystal substrates 3 and 4. Upper and lower planes of a central portion 2a of the crystal substrate 2 are recessed and shaped into so-called inverse mesas, thereby forming inner spaces Ss above and under the central portion 2a. Exciting electrodes 5a, 5b are provided on the upper and lower planes of the central portion 2a of the crystal substrate 2 to actively vibrate the central portion. The exciting electrode 5b on the lower plane is electrically coupled to a mounting terminal portion 7 via a drawing electrode 6b. The exciting electrode 5a on the upper plane is drawn via a drawing electrode 6a up to an inner plane of a through hole 9 and electrically coupled to the mounting terminal portion 7.

The crystal substrate 3 has through holes 8, 8 at positions where the drawing electrodes 6a, 6b are provided. Filled in these through holes 8, 8 are conductive materials 10, connected to the drawing electrodes 6a, 6b. These conductive materials 10, 10 are slightly protruding from a lower plane of the crystal substrate 3, and the protruding portions make the mounting terminal portions 7, 7.

Further, the crystal substrates 3 and 4 are bonded and fixed using a metallic brazing material 11 such as gold/tin, interposing the crystal substrate 2 therebetween. Since it is necessary to seal the inner space S, the brazing material 11 is circumferentially provided and then heated and melted to bond the three crystal substrates 2, 3, 4 together.

Unexamined Patent Publication No. 2004-328442

Such a piezoelectric device 1 is structured so that the drawing electrodes 6a, 6b come in contact with the brazing material 11. Thus, when the brazing material 11 is heated and melted in order to bond the crystal materials 2, 3, 4 together, the metallic brazing material 11 such as gold/tin spreads to the drawing electrodes 6a, 6b. If the spreading extends to the exciting electrodes 5a, 5b, the brazing material 11 attaches to the exciting electrodes 5a, 5b and increases the weight of the central portion 2a. This results in fluctuation of the crystal impedance level (hereunder referred to as "IC level") and the frequency, making it impossible to obtain desired characteristics of the piezoelectric device.

Also, when the brazing material 11 is heated and melted so as to bond the crystal substrates 2, 3, 4, so-called solder eating occurs, in which the drawing electrodes 6a, 6b are absorbed in the metallic brazing material such as gold/tin. If such solder eating spreads to the exciting electrodes 5a, 5b, portions of the exciting electrodes 5a, 5b are absorbed, reducing the weight of the central portion 2a. This results in fluctuation of the CI level and the frequency, making it impossible to obtain the desired characteristics of the piezoelectric device.

As herein described, there is a problem that the CI level and the frequency fluctuate due to the spreading of brazing material 11 or the solder eating and that it becomes impossible to obtain the desired characteristics of the piezoelectric device.

SUMMARY

In order to solve the problem above, an objective of the disclosure is to provide a piezoelectric device with which it is possible to prevent the brazing material from attaching to a vibrating area, prevent the solder eating, and to thereby obtain excellent vibration characteristics.

In a first embodiment, the mentioned objective is achieved by a piezoelectric device including: a piezoelectric element having, on a surface of a piezoelectric body, an exciting electrode and a drawing electrode that is electrically coupled to the exciting electrode and draws an electrode to an external section, and a substrate bonded to the drawing electrode with a metallic brazing material, in that: the piezoelectric element contains a connecting electrode connecting the exciting electrode with the drawing electrode; and the connecting electrode and/or the exciting electrode contains an underlying layer provided on the surface of the piezoelectric body and a surface layer section provided on a surface of this underlying layer, wherein: the underlying layer is provided using the metallic brazing material and a metallic material of adverse wettability; and a portion of the surface layer section is removed in a manner that the exciting electrode and the drawing electrode are separated.

According to the structure of the first embodiment, the piezoelectric device is equipped with the piezoelectric element having the exciting electrode and the drawing electrode electrically coupled to the exciting electrode and with the substrate bonded to the drawing electrode with the metallic brazing material. Also, the piezoelectric element includes the connecting electrode connecting the exciting electrode to the drawing electrode. Thus, there is a possibility that, when bonding the drawing electrode to the substrate, the heated and melted metallic brazing material flows along the connecting electrode to the exciting electrode.

However, according to the structure of the first embodiment, the underlying layer of the connecting electrode and/or the exciting electrode is provided using the metallic brazing material and the metallic material of adverse wettability, and the portion of the surface layer section is removed in a manner that the exciting electrode is separated from the drawing electrode. Accordingly, the surface layer section is divided so that the exciting electrode is separated from the drawing electrode at a position of the connecting electrode, for example, and this divided portion exposes the metallic brazing material and the metallic material of adverse wettability and stops the spread of the metallic brazing material. Therefore, it is possible to effectively prevent a situation in which the metallic brazing material flows toward the exciting electrode and to further prevent the solder eating by blocking the metallic brazing material from flowing.

As a result, it is possible to prevent the brazing material from attaching to the vibrating area, prevent the solder eating, and to thereby provide the piezoelectric device having excellent vibration characteristics.

In a second embodiment according to the structure of the first embodiment, the drawing electrode, the exciting electrode, and the connecting electrode are composed of a same layer structure and a same material except the portion of the surface layer section.

According to the structure of the second embodiment, the drawing electrode, the exciting electrode, and the connecting electrode are composed of the same layer structure and material and thus can be provided simultaneously. As a result, the structure may be formed relatively simply, except the portion of the surface layer section, and may respond to a downsized piezoelectric device.

In a third embodiment according to the structure of the first or the second embodiment, the piezoelectric body contains a frame surrounding the exciting electrode, a principal plane of the frame having the drawing electrode; and the substrate includes a lid substrate and a base substrate interposing the principal plane of the frame therebetween.

According to the structure of the third embodiment, the piezoelectric body contains the frame surrounding the exciting electrode, and the principal plane of the frame is provided with the drawing electrode. However, the principal plane of the frame is interposed between the lid substrate and the base substrate. Thus, when placed between the lid substrate and the base substrate, a pressure is applied, and the metallic brazing material starts flowing along the connecting electrode more toward the exciting electrode. However, because the third embodiment includes the structure of the first embodiment, the metallic brazing material may be effectively prevented from flowing to the exciting electrode.

In a fourth embodiment according to the structure of any of the first to third embodiments, the connecting electrode is sloped downward from a side adjacent to the drawing electrode to a side adjacent to the exciting electrode.

According to the structure of the fourth embodiment, because the connecting electrode is sloped downward from the side adjacent to the drawing electrode to the side adjacent to the exciting electrode, the metallic brazing material that has spread along the connecting electrode more readily flows toward the exciting electrode. However, because the fourth embodiment includes the structure of the first embodiment, the flow of the metallic brazing material to the exciting electrode may be effectively prevented.

In a fifth embodiment according to the structure of any of the first to fourth embodiment, the connecting electrode contains a recess whose inner bottom surface is the exposed metallic material of adverse wettability.

According to the structure of the fifth embodiment, the connecting electrode contains the recess whose inner bottom surface is the exposed metallic material of adverse wettability. As a result, even if the metallic brazing material flows to the exposed metallic material of adverse wettability, the metallic brazing material is accumulated inside the recess, and it is possible to prevent the metallic brazing material from flowing to the exciting electrode.

In a sixth embodiment according to the structure of any of the first to fifth embodiment, the underlying layer has a thickness dimension larger than a thickness of at least the surface layer section.

According to the structure of the sixth embodiment, the underlying layer has the thickness dimension larger than the thickness of at least the surface layer section. Thus, the conductivity of the underlying layer may improve by increasing the sectional area of the underlying layer made of the metallic material. As a result, it is possible to effectively solve a problem of decrease in the conductivity between the drawing electrode and the exciting electrode that occurs in a situation that the surface layer section is removed at the portion exposing the underlying layer.

In a seventh embodiment according to the structure of any of the first to sixth embodiment, the underlying layer is composed of at least three layers, a mid layer thereof being made by disposing a metal having an electric resistance value lower than that of the metallic material of adverse wettability.

According to the structure of the seventh embodiment, the underlying layer is composed of at least three layers, and the mid layer is made by disposing a metal having an electric resistance value lower than that of the metallic material of adverse wettability. Therefore, even if the portion of the metallic material of adverse wettability has high electric resistance and low conductivity, it is possible to obtain a piezoelectric device with excellent vibration characteristics by establishing good conductance between the drawing electrode and the exciting electrode at the mid layer metal portion having a low electric resistance.

DETAILED DESCRIPTION OF EMBODIMENTS

Figure 1:
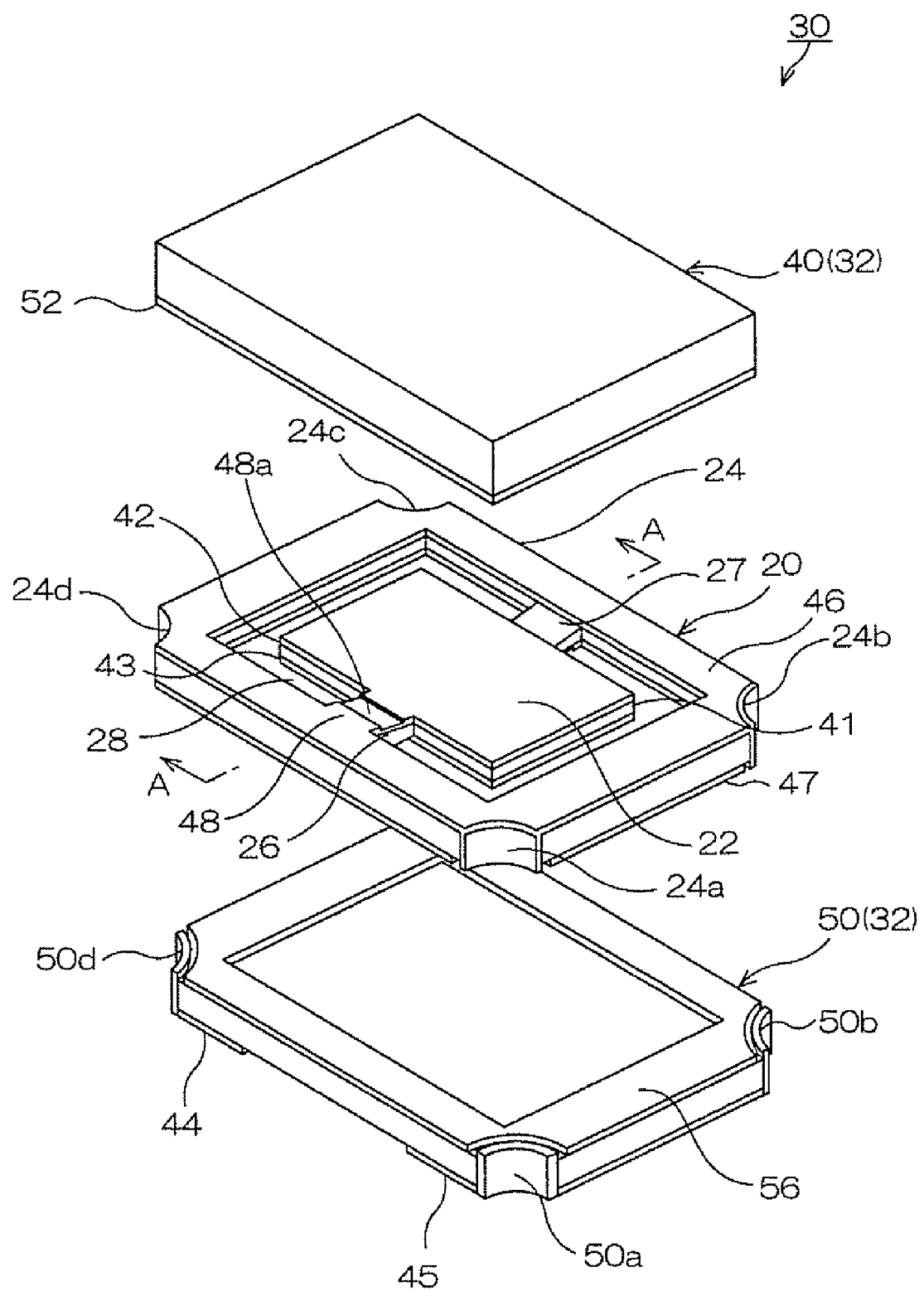
FIG. 1 is an exploded, perspective, schematic view of a piezoelectric device according to a first embodiment of the disclosure.
Figure 2A:
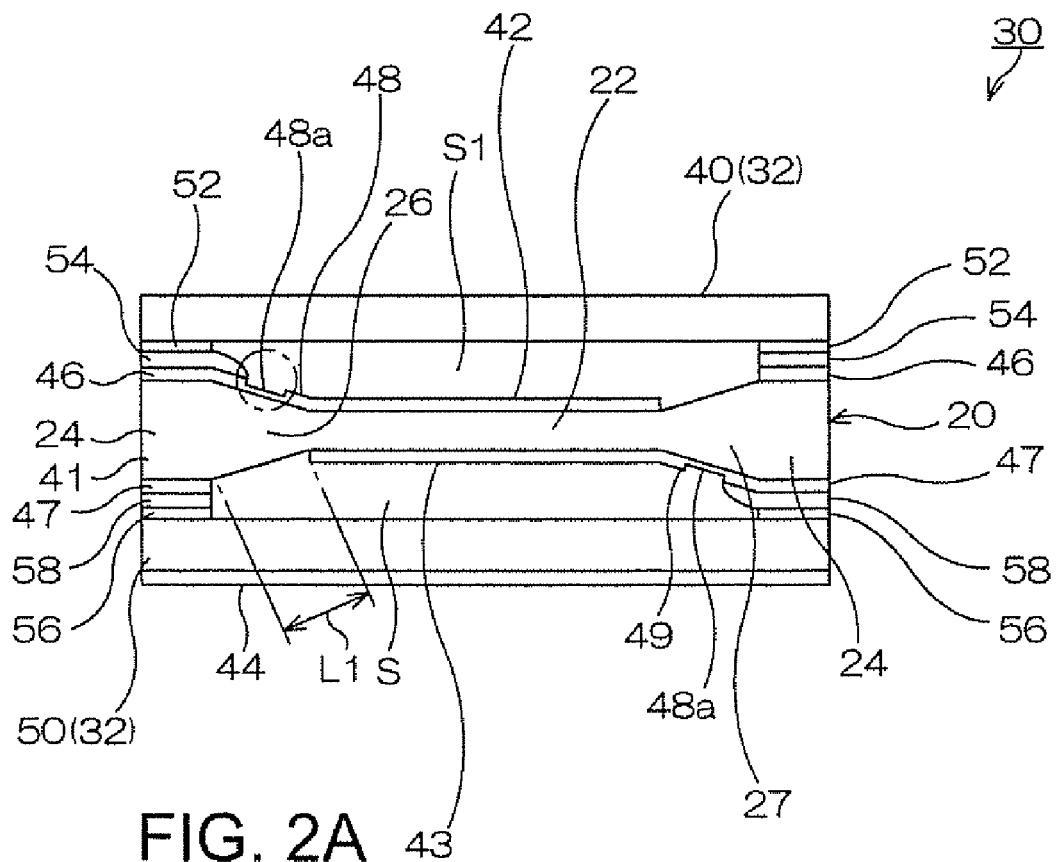
FIG. 2(a) is a schematic sectional diagram taken on a line A-A of the piezoelectric device of FIG. 1 as assembled.
Figure 2B:
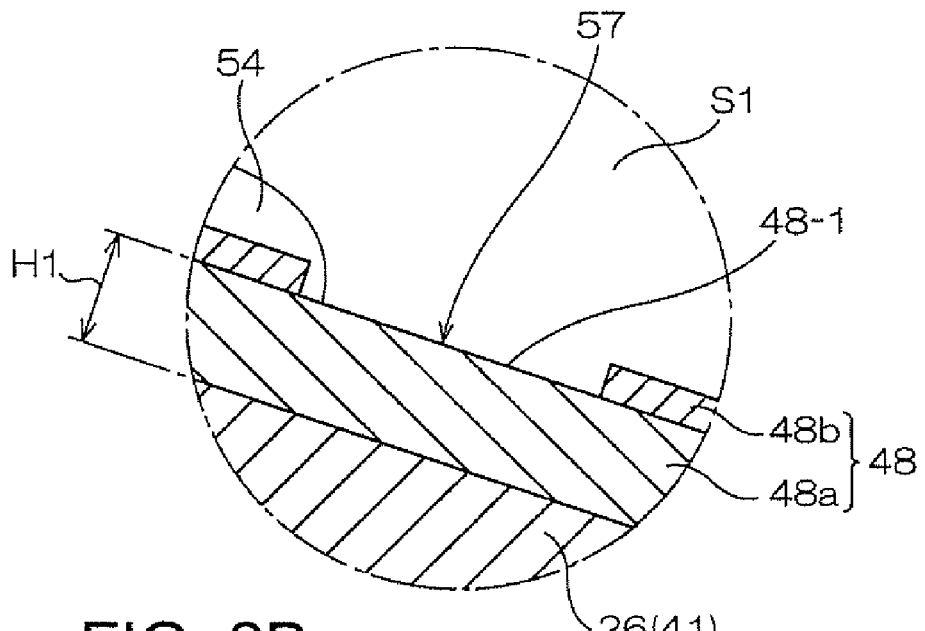
FIG. 2(b) is an enlarged sectional diagram of a portion surrounded by a dash-dotted circular line of FIG. 2(a)

FIGS. 1 and 2 show a piezoelectric device 30 according to the first embodiment of the disclosure. FIG. 1 is an exploded, perspective, schematic view of the device 30. FIG. 2(a) is a schematic sectional diagram taken on a line A-A of the piezoelectric device of FIG. 1 as assembled, and FIG. 2(b) is an enlarged sectional diagram of a portion surrounded by a dash-dotted circular line of FIG. 2(a).

In these drawings, the piezoelectric device 30 exemplifies a piezoelectric resonator and includes a piezoelectric element 20 and a substrate 32 that is bonded to this piezoelectric element 20. In the present embodiment, the substrate 32 is composed of a lid substrate 40 and a base substrate 50 interposing the piezoelectric element 20 therebetween.

The piezoelectric element 20 will be described first.

The piezoelectric element 20 includes exciting electrodes 42, 43 and drawing electrodes 46, 47 on the surface of a piezoelectric body 41.

The piezoelectric body 41 is made of quartz crystal, for example. Other than quartz crystal, piezoelectric materials such as lithium tantalite may be used. In this embodiment, the piezoelectric body 41 is so-called AT cut, in that a quartz crystal wafer is cut in predetermined directions. Also, the piezoelectric body 41 is equipped with a vibrating section 22 in the center, a frame 24 surrounding this vibrating section 22, and supports 26, 27 connecting the vibrating section 22 with the frame 24.

The vibrating section 22 in the center is a vibrating area having a thickness corresponding to an oscillation frequency. In this embodiment, the vibrating section 22 is made by being cut into rectangles by chemical etching or blasting using a resist pattern that is formed by photolithography, and is further made to be thinner than the frame 24. Consequently, as shown in FIG. 2, when the vibrating section 22 is disposed between the lid substrate 40 and the base substrate 50, a sealed inner space S1 is created around the vibrating section 22.

Then, the exciting electrodes 42, 43 of opposite polarities are provided on upper and lower planes that are main planes of this thin area, by sputtering chromium (Cr), nickel (Ni), or titanium (Ti) on the base (underlying layer) and gold (Au) or silver (Ag) on the front surface (surface layer section). As a result, an electric field is efficiently generated between the exciting electrode on the upper plane and the exciting electrode on the lower plane, and the vibrating section 22 performs thickness slide oscillation.

The frame 24 is formed surrounding the vibrating section 22. The principal plane of the frame 24 is interposed between the lid substrate 40 and the base substrate 50, and this interposed region becomes a region for securing the piezoelectric element 20.

In this embodiment, the outer dimension of the frame 24 is substantially equal to the outer dimensions of the lid substrate 40 and the base substrate 50. Also, the frame 24 is made thicker than the vibration section 22, and, as shown in FIG. 1, castellations 24a, 24b, 24c, 24d are provided by cutting near the corners of the frame 24 into four quarters of a circle in plan view. These castellations 24a, 24b, 24c, 24d become a guide for cutting out the piezoelectric element 20 from a wafer and conductive paths for electrically coupling the exciting electrodes 42, 43 with mounting terminal portions 44, 45 disposed on the bottom surface.

In other words, on the entire periphery of the upper and lower planes, that is the principal planes, of the frame 24, the drawing electrodes 46, 47 that are electrically coupled to the exciting electrodes 42, 43 while drawing the electrodes outside are provided. These drawing electrodes 46, 47 are composed of the same layer structure and material as are the exciting electrodes 42, 43 and made by sputtering, e.g., chromium (Cr), nickel (Ni), or titanium (Ti) on the base and gold (Au) or silver (Ag) on the front surface. Then, the drawing electrode 46 on the upper plane is drawn via the castellations 24a, 24b on the front and right sides of FIG. 1 and via castellations 50a, 50b of the base substrate 50 on the front and right sides of FIG. 1 and is coupled to the mounting terminal portion 45. Also, the drawing electrode 47 on the lower plane is drawn via a castellation 50d provided on the base substrate 50 on the left side of FIG. 1 and via a castellation (not shown) on the rare side of FIG. 1 and is coupled to the mounting terminal portion 44.

Then, the vibrating section 22 in the center is connected to the frame 24 surrounding this vibrating section 22 with the supports 26, 27. The supports 26, 27 support the vibrating section 22 by suspending the same and act as the paths for electrically coupling the exciting electrodes 42, 43 to the drawing electrodes 46, 47.

Specifically, only two supports 26, 27 are provided at about the center of the opposing side surfaces of the vibrating section 22. Thus, a space between the vibrating section 22 and the frame 24, where the supports 26, 27 are not provided, becomes a through hole 28.

Provided on the upper surface of one support 26, out of the plurality of supports 26, 27, is a connecting electrode 48 connecting the exciting electrode 42 of the vibrating section 22 with the drawing electrode 46 of the frame 24. Provided also on the other, lower surface of the support 27, as shown in FIG. 2, is a connecting electrode 49 connecting the exciting electrode 43 of the vibrating section 22 with the drawing electrode 47 of the frame 24. The connecting electrodes 48 and 49 are arranged so as not to come in contact with each other.

These connecting electrodes 48, 49 are composed of the same layer structure and material as are the exciting electrodes 42, 43 and the drawing electrodes 46, 47, except a portion (portion where an underlying layer 48a is exposed) of a surface layer section 48b which will be described later. These connecting electrodes 48, 49 will be described in detail hereafter.

Further, the supports 26, 27 are formed in a manner that they become gradually thinner from the frame 24 toward the vibrating section 22. Thus, the connecting electrode 48 is sloped downward from the drawing electrode 46 to the exciting electrode 42. That is, the connecting electrode 48 has a sloped plane that is high at a side adjacent the frame 24 and low at a side adjacent the vibrating section 22.

The substrate 32 will now be described.

The substrate 32 is a member to be bonded and fixed to the piezoelectric element 20 so as to seal the vibrating area. In the embodiment, the substrate 32 is bonded to the piezoelectric element 20 by thermo-compression with the frame interposed therebetween and includes the lid substrate 40 and the base substrate 50.

Specifically, the substrate 32 is formed using an insulating material. In the embodiment, a member such as quartz crystal or glass having substantially the same thermal expansion coefficient as that of the piezoelectric element 20 is selected in order to avoid cracks that may be made by a stress generated when heating the piezoelectric element 20 interposed between the lid substrate 40 and the base substrate 50.

The lid substrate 40 has substantially the same outer dimension as that of the piezoelectric element 20 and is formed in a rectangle shape. The entire circumferential edge of a lower plane of the lid substrate 40 is coated with a bonding metal film 52 through sputtering, e.g., chromium (Cr) and gold (Au). As shown in FIG. 2(a), a metallic brazing material 54 such as gold/tin is applied between the bonding metal film 52 and the drawing electrode 46 on the surface of the frame 24, thereby bonding the lid substrate 40 to the frame 24.

The base substrate 50, also, has substantially the same outer dimension as that of the piezoelectric element 20 and is formed in a rectangle shape. Further, as shown in FIG. 1, the base material 50 includes the mounting terminal portions 44, 45 on the lower plane thereof and the castellations 50a, 50b, 50d that become the conductive paths for electrically coupling these mounting terminal portions 44, 45 to the drawing electrodes 46, 47.

Then, the entire circumferential edge of the base substrate 50 is bonded to the frame 24 of the piezoelectric element 20. An upper plane of the base substrate 50 is coated with a bonding metal film 56 through sputtering, e.g., chromium (Cr) and gold (Au). As shown in FIG. 2(a), a metallic brazing material 58 such as gold/tin is applied between the bonding metal film 56 and the drawing electrode 47 on a lower plane of the frame 24, thereby bonding the base substrate 50 to the frame 24.

The connecting electrodes 48, 49 that connect the exciting electrodes 42, 43 with the drawing electrodes 46, 47 have the following characteristics. Note that, because the connecting electrodes 48 and 49 have substantially the same structure, except that they are facing different directions, only the connecting electrode 48 will be described below.

Referring to FIG. 2(b), the connecting electrode 48 includes the underlying layer 48a provided on the surface of the piezoelectric body 41 and the surface layer section 48b provided on the surface of this underlying layer 48a.

The surface layer section 48b is a member that enables good conduction between the exciting electrodes 42, 43 and the drawing electrodes 46, 47 and is formed by sputtering, e.g., gold (Au) or silver (Ag).

The underlying layer 48a is a member that bonds the surface layer section 48b having good conductivity with the supports 26, 27 of the piezoelectric body 41 made of quartz crystal. The underlying layer 48a in the embodiment is formed using the metallic brazing material 54 and a metallic material of adverse wettability through sputtering, e.g., chromium (Cr), nickel (Ni), or titanium (Ti).

In other words, in the embodiment, the connecting electrode 48 is composed of the same layer structure and material as are the drawing electrode 46 and the exciting electrode 42.

Then, a part of the surface layer section 48b is removed so as to separate the exciting electrode 42 from the drawing electrode 46. In the embodiment, the surface layer section 48b in the middle of the connecting electrode 48 is removed so as to divide the surface layer section 48b. As a result, the metallic material of adverse wettability of the underlying layer 48a is exposed, separating the exciting electrode 42 from the drawing electrode 46.

More specifically, with reference to FIG. 1, the underlying layer 48a takes the whole width of the connecting electrode 48 and is exposed to the inner space S1. Referring to FIG. 2(b), a recess 57 is provided, and the inner bottom of the recess 57 is a portion 48-1 of this exposed metallic material of adverse wettability. Accordingly, even if the metallic brazing material 54 flows toward the exciting electrode 42, the metallic brazing material 54 is accumulated inside this recess 57, thereby effectively preventing the metallic brazing material 54 from flowing to the exciting electrode 42.

Then, as described above, the exposed portion 48-1 of the underlying layer 48a is exposed to the inner space 51 while taking the whole width of the connecting electrode 48, and, thus, the exposed portion 48-1 is in such a situation that the surface layer section 48b enabling good conduction is removed. Thus, there is a possibility that the conductivity between the exciting electrode 42 and the drawing electrode 46 deteriorates. Therefore, with the understanding that the conductivity improves if the sectional area increases, the underlying layer 48a of the embodiment is made to have a thickness H1 larger than the thickness of at least the surface layer section 48b so as to secure conductivity between the drawing electrode 46 and the exciting electrode 42. The thickness H1 can be determined depending on the kind of member composing the underlying layer 48a.

The first embodiment of the disclosure has the structure as described above, in which the underlying layer 48a of the connecting electrode 48 is composed of the metallic brazing material 54 and the metallic material of adverse wettability, and in which the metallic material of adverse wettability is exposed while separating the exciting electrode 42 from the drawing electrode 46. Therefore, when bonding the drawing electrode 46 to the substrate 32, the heated and melted metallic brazing material 54 stops spreading because of its adverse wettability at the position of the exposed underlying layer 48a even if the material 54 runs to the connecting electrode 48. Accordingly, it is possible to effectively prevent the metallic brazing material 54 from running along the connecting electrode 48 to flow toward the exciting electrode 42.

Also, in the embodiment, because the drawing electrode 46 and the exciting electrode 42 are composed of the same layer structure and material as is the connecting electrode 48 as described above, the drawing electrode 42, the exciting electrode 46, and the connecting electrode 48 can be formed simultaneously. Therefore, it is relatively easy to expose the underlying layer 48a and to respond to the downsized piezoelectric device 30. In other words, even though the structure of the embodiment is employed so that the outflow of the metallic brazing material 54 is prevented, it is still possible to provide the downsized piezoelectric device 30.

Moreover, because the surface layer section 48b is split at the exposed portion of the underlying layer 48a, it is possible to prevent the so-called solder eating, in which the surface layer section 48b is absorbed in the metallic brazing material 54, at the exposed portion of the underlying layer 48a.

As a result, it is possible to provide the piezoelectric device with which the spread of the brazing material or the solder eating caused by the brazing material is prevented and with which excellent vibration characteristics are obtained.

Figure 3:
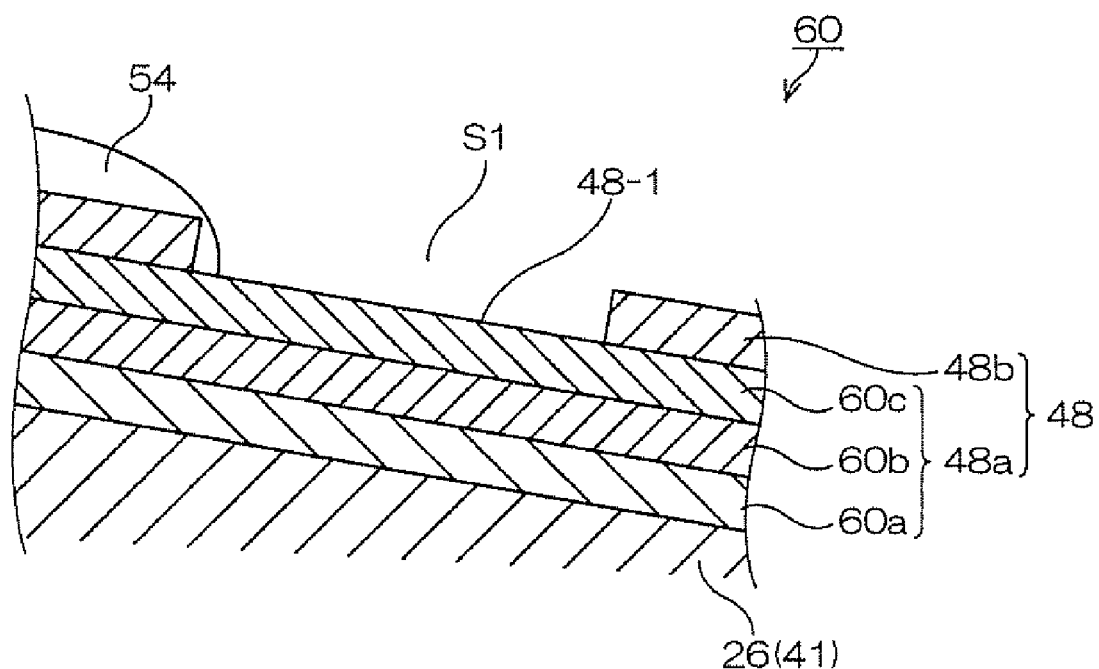
FIG. 3 is an enlarged sectional diagram of a portion corresponding to the enlarged sectional portion shown in FIG. 2(b), explaining the characteristic features of a piezoelectric device according to a second embodiment of the disclosure.

FIG. 3 is a diagram explaining the characteristic features of a piezoelectric device 60 according to the second embodiment of the disclosure and shows an enlarged section of a portion corresponding to the enlarged sectional portion shown in FIG. 2(b).

In this drawing, the elements with identical reference numbers have the same structures as those used in FIGS. 1 and 2. Thus, the explanations thereof will not be repeated, and differences will mainly be explained.

The differences between this piezoelectric device 60 and the piezoelectric device 30 of the first embodiment are the structures of the underlying layers of the connecting electrodes 48, 49 (see FIG. 2). Since the connecting electrodes 48, 49 have substantially the same structure, only the connecting electrode 48 will be explained below.

With reference to FIG. 3, the underlying layer 48a of the connecting electrode 48 is composed of three layers 60a, 60b, 60c. Similar to the first embodiment, an uppermost layer 60c is made by disposing the metallic brazing material 54 and the metallic material of adverse wettability (e.g., chromium, nickel, or titanium), with one portion 48-1 thereof exposed to the inner space S1.

A mid layer 60b of the three layers is made by disposing a metal that is a member that bonds strongly with the uppermost layer 60c and has an electric resistance value lower than that of the uppermost layer 60c made of the metallic material of adverse wettability. Specifically, the mid layer 60b is made of gold (Au) or silver (Ag).

A lowermost layer 60a is made from a member that bonds the mid layer 60b to the piezoelectric body 41, such as chromium (Cr), nickel (Ni), or titanium (Ti).

Note that, with the piezoelectric device 60 of the second embodiment, also, the drawing electrode 46 and the exciting electrode 42 (see FIG. 2) have the three-layer structure made from the same members as does the connecting electrode 48.

Further, the disclosure is not limited to the above-mentioned structure. For example, the underlying layer 48a of the connecting electrode 48 may be composed of four or more layers. However, it is preferable that the underlying layer 48a of the connecting electrode 48 be composed of the three layers 60a, 60b, 60c as in the second embodiment, from a viewpoint that the thickness dimension of the entire the piezoelectric device 60 should be downsized.

The second embodiment is composed as described above and, accordingly, has the same operational effect as that of the first embodiment. Also, the underlying layer 48a is composed of the three layers 60a, 60b, 60c, and the mid layer 60b is made by disposing the metal having an electric resistance value lower than that of the uppermost layer 60c made of the metallic material of adverse wettability. Therefore, even if one portion of the connecting electrode 48 lacks the surface layer section 48b that enables conductivity, it is possible to establish good conductance between the drawing electrode 46 and the exciting electrode 42 because of the portion of the mid layer 60b made of the metal with low electric resistance. As a result, it is possible to obtain the piezoelectric device 60 having excellent vibration characteristics.

Figure 4:
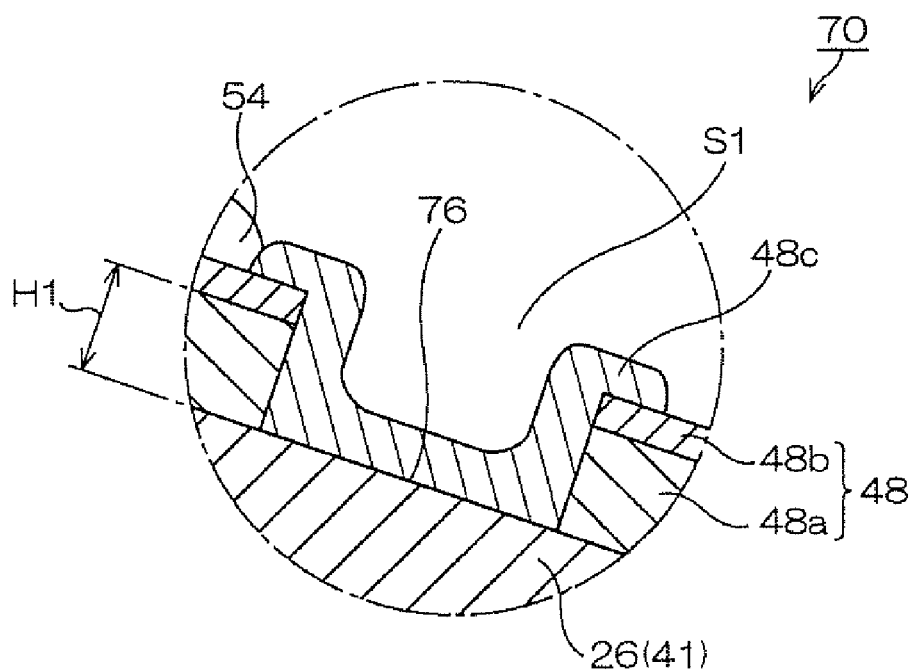
FIG. 4 is an enlarged sectional diagram of a portion corresponding to the enlarged sectional portion shown in FIG. 2(b), explaining the characteristic features of a piezoelectric device according to a third embodiment of the disclosure.

FIG. 4 is a diagram explaining the characteristic features of a piezoelectric device 70 according to the third embodiment of the disclosure and shows an enlarged sectional diagram of a portion corresponding to the enlarged sectional portion shown in FIG. 2(b).

In this drawing, the elements with identical reference numbers have the same structures as those used in FIGS. 1 and 2, and the explanations thereof will not be repeated.

The differences between this piezoelectric device 70 and the piezoelectric device 30 of the first embodiment are the structures of the connecting electrodes 48, 49 (see FIG. 2). Since the connecting electrodes 48, 49 have substantially the same structure, only the connecting electrode 48 will be explained.

In this embodiment, the surface layer section 48b and the underlying layer 48a of the connecting electrode 48 are removed (split in this embodiment) at the same position, separating the exciting electrode 42 from the drawing electrode 46 (see FIG. 2). Also, a metal film 48c is formed in this split section 76.

This metal film 48c is made of the metallic brazing material 54 and the metallic material of adverse wettability, such as chromium (Cr), nickel (Ni), or titanium (Ti), through sputtering. The metal film 48c is coated not only on the split section 76 but also on the surface layer section 48b adjacent to the split section 76.

In the third embodiment, also, the heated and melted metallic brazing material 54 stops spreading at the position of the metal film 48c due to its adverse wettability. Accordingly, it is possible to effectively prevent the metallic brazing material 54 from flowing toward the exciting electrode 42.

Moreover, because the surface layer section 48b is split while separating the exciting electrode 42 from the drawing electrode 46 as shown in FIG. 2, it is possible to prevent the so-called solder eating in which the surface layer section 48b is absorbed in the metallic brazing material 54 at the portion of the surface layer film 48c.

As a result, it is possible to provide the piezoelectric device with which the spread of the brazing material or the solder eating caused by the brazing material is prevented, and with which excellent vibration characteristics are obtained.

Figure 5:
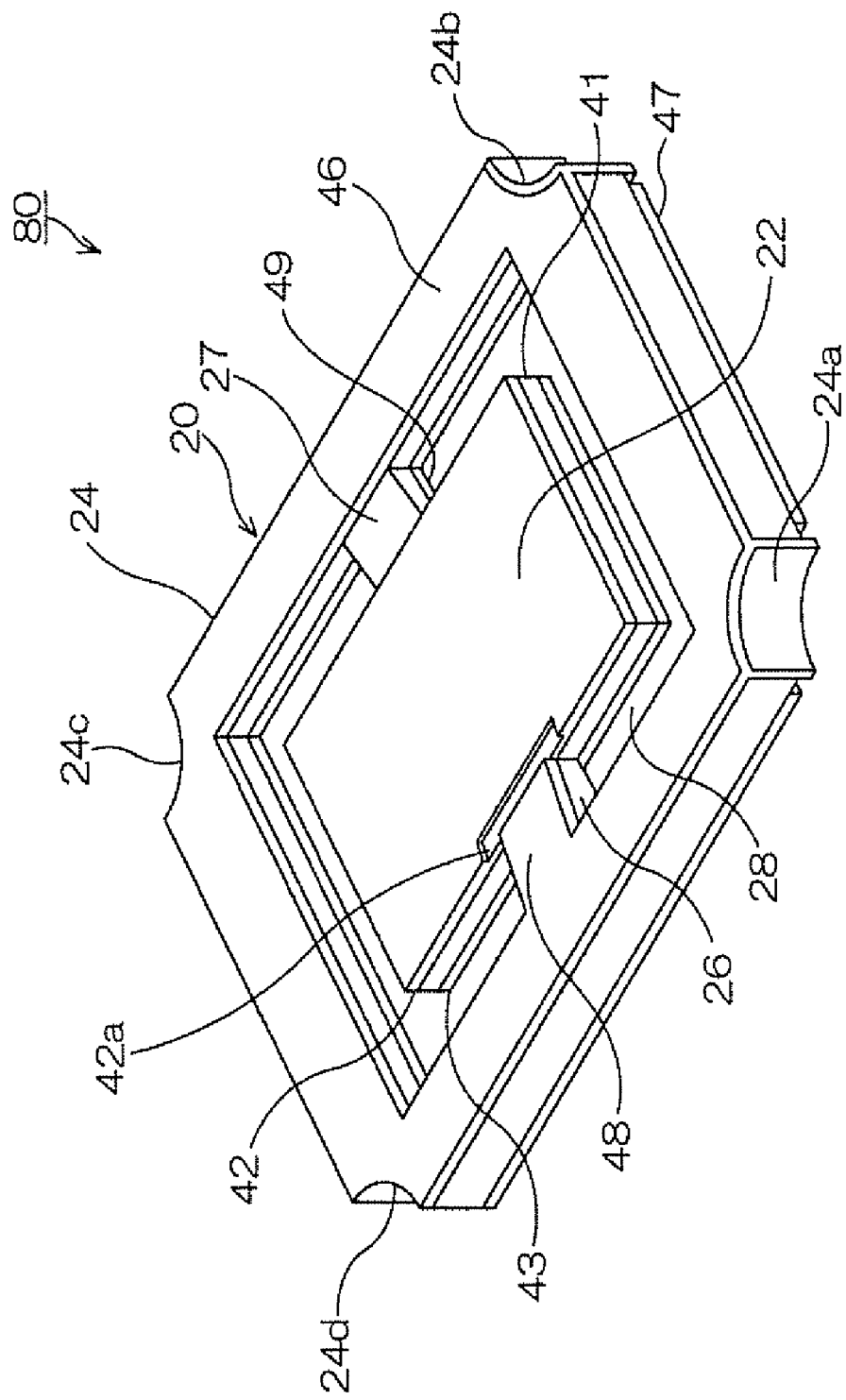
FIG. 5 is an exploded, perspective, schematic view of a piezoelectric element used in a piezoelectric device according to a fourth embodiment of the disclosure.

FIG. 5 is an exploded, perspective, schematic view of the piezoelectric element 20 used in a piezoelectric device 80 according to the fourth embodiment of the disclosure.

In this drawing, the elements with identical reference numbers have the same structures as those used in FIGS. 1 and 2. Thus, the explanations thereof will not be repeated, and differences will mainly be explained.

The differences between this piezoelectric device 80 and the piezoelectric device 30 of the first embodiment are the structures of the connecting electrodes 48, 49 and the exciting electrode 42, 43. Since the connecting electrodes 48, 49 have substantially the same structure, and the exciting electrodes 42, 43 have substantially the same structure, only the connecting electrode 48 and the exciting electrode 42 will be explained below.

With the piezoelectric device 80 of this embodiment, a portion exposing the underlying layer is not the portion of the connecting electrode 48 but a portion of the exciting electrode 42. Specifically, a surface layer section, made of gold (Au) or silver (Ag), of the exciting electrode 42 adjacent to the connecting electrode 48 is removed, separating the drawing electrode 46 from the exciting electrode 42 and thereby exposing chromium (Cr), nickel (Ni), or titanium (Ti) that is the underlying layer 42a.

In the fourth embodiment, also, the heated and melted metallic brazing material 54 stops spreading at the position of the metal film 48c due to its adverse wettability. Accordingly, it is possible to effectively prevent the metallic brazing material 54 from flowing toward the exciting electrode 42.

Moreover, because the portion of the surface layer section of the exciting electrode 42 is removed while separating the drawing electrode 46 from the exciting electrode 42, it is possible to prevent the so-called solder eating in which the surface layer section is absorbed in the metallic brazing material at the exposed portion of the underlying layer 42a.

As a result, it is possible to provide the piezoelectric device with which the spread of the brazing material or the solder eating caused by the brazing material is prevented, and with which excellent vibration characteristics are obtained.

The disclosure is not limited to the above-described embodiments. Any structure of any of the embodiments may suitably be omitted, combined with other structures of other embodiments, or combined with structures not shown in the drawings.

For example, a plurality of exposed portions of the underlying layer may be provided at a plurality of places, or may be provided at both the portion of the connecting electrode and the portion of the exciting electrode.

Moreover, another embodiment is possible within the scope of the disclosure, in that the surface layer section of the drawing electrode and the surface layer section of the exciting electrode are not completely divided, as described in the following.

Figure 6A:
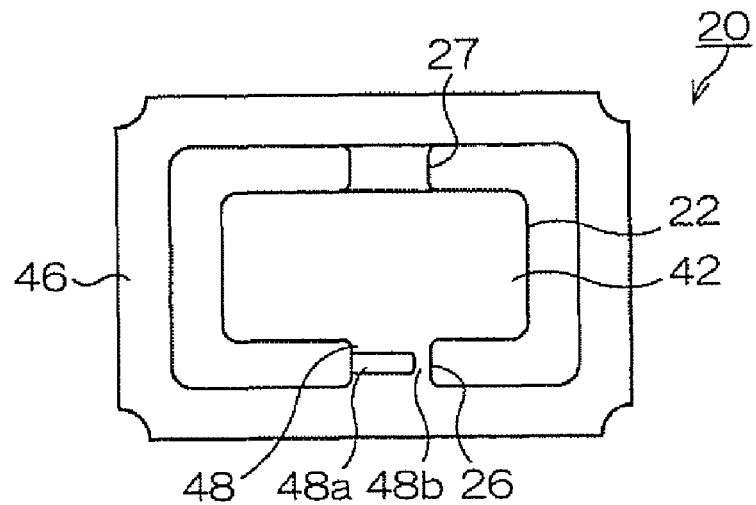
FIG. 6 show schematic plan diagrams of modified examples of the piezoelectric element used in the piezoelectric device of the disclosure.

FIG. 6 shows schematic plan diagrams of modified examples of the piezoelectric element 20 used in the piezoelectric device of the disclosure. As shown in FIG. 6(a) that is one of the modified examples, only a portion of the surface layer section of the connecting electrode 48 may be removed in a width direction, exposing the portion of the underlying layer 48a in the width direction.

Figure 6B:
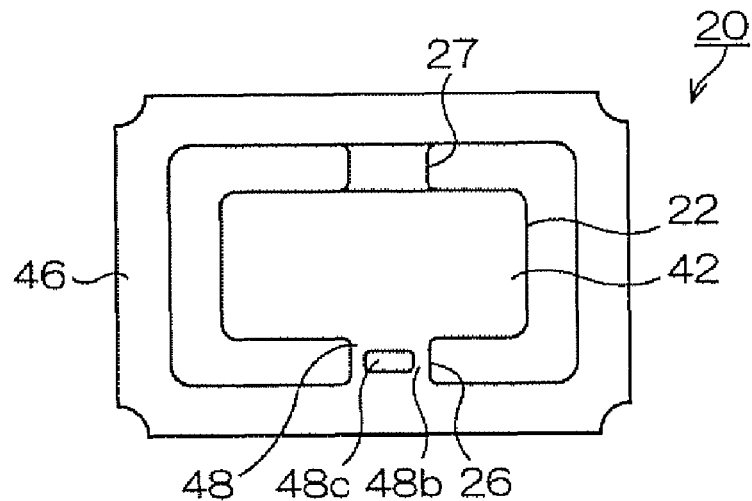

Also, as shown in FIG. 6(b) that is another one of the modified examples, the surface layer section and the underlying layer of the connecting electrode 48 may be removed in the width direction at the same one portion. The removed portion may include the metallic brazing material and the metal film 48c of adverse wettability.

Figure 6C:
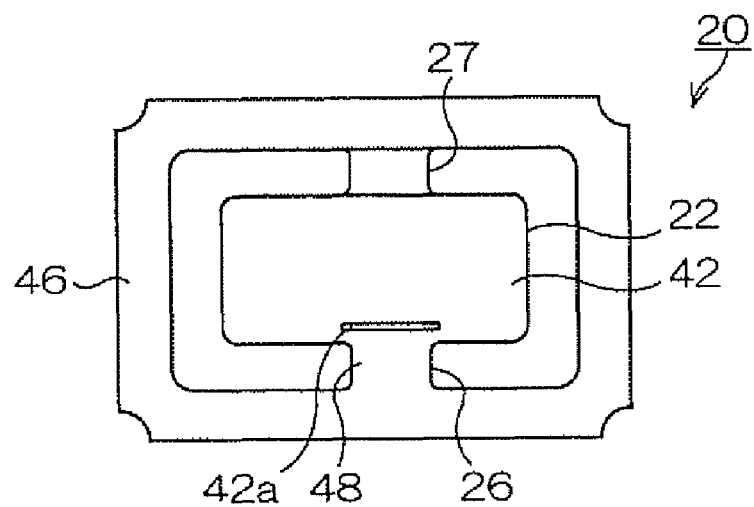
Figure 7:
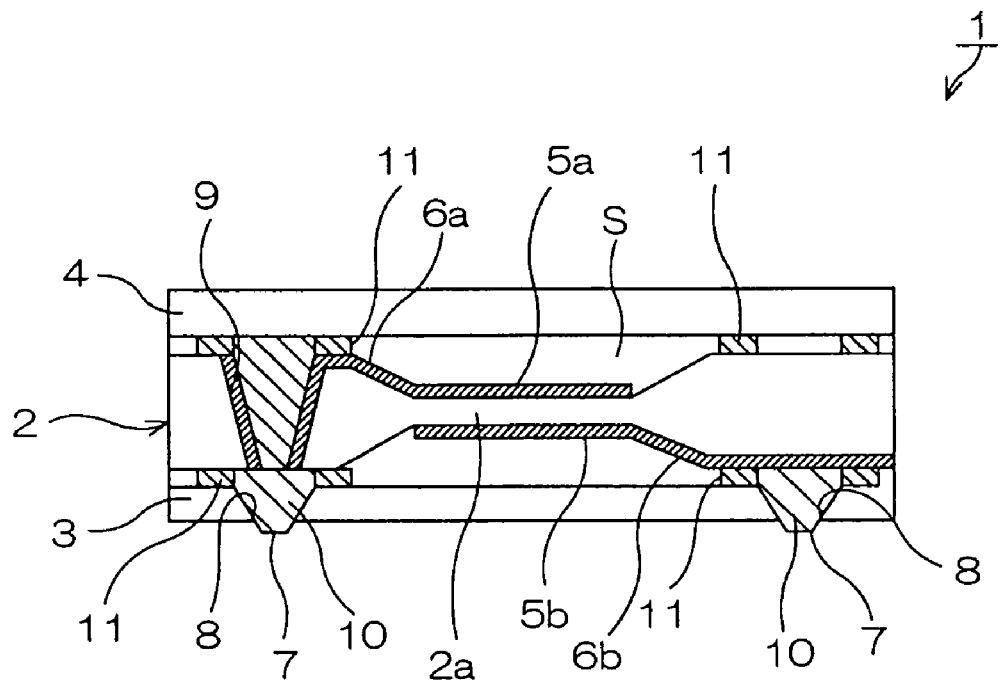
FIG. 7 is a schematic sectional diagram of an existing piezoelectric device.

Further, as shown in FIG. 6(c) that is yet another one of the modified examples, a portion of the surface layer section of the exciting electrode 42 may be removed so that the drawing electrode 46 and the exciting electrode 42 are electrically connected at the surface layer section on the periphery of the exposed underlying layer 42a.

The invention claimed is:

1. A piezoelectric device, comprising: a piezoelectric element having, on a surface of a piezoelectric body, an exciting electrode and a drawing electrode that is electrically coupled to the exciting electrode and draws an electrode to an external section, and a substrate bonded to the drawing electrode with a metallic brazing material, wherein:

the piezoelectric element contains a connecting electrode connecting the exciting electrode with the drawing electrode; and the connecting electrode and/or the exciting electrode contains an underlying layer provided on the surface of the piezoelectric body and a surface layer section provided on a surface of this underlying layer, wherein:

the underlying layer having a connected portion of the exciting electrode and the drawing electrode, is provided using the metallic brazing material and a metallic material of adverse wettability; and a portion of the surface layer section is removed in a manner that the connected portion of the exciting electrode and the drawing electrode provided by the surface layer, are separated.

2. The piezoelectric device according to claim 1, wherein the drawing electrode, the exciting electrode, and the connecting electrode are composed of a same layer structure and a same material except the portion of the surface layer section.

3. The piezoelectric device according to claim 1, wherein:

the piezoelectric body contains a frame surrounding the exciting electrode, a principal plane of the frame having the drawing electrode; and the substrate includes a lid substrate and a base substrate interposing the principal plane of the frame therebetween.

4. The piezoelectric device according to claim 1, wherein the connecting electrode is sloped downward from a side adjacent to the drawing electrode to a side adjacent to the exciting electrode.

5. The piezoelectric device according to claim 1, wherein the connecting electrode contains a recess whose inner bottom surface is the exposed metallic material of adverse wettability.

6. The piezoelectric device according to claim 1, wherein the underlying layer has a thickness dimension larger than a thickness of at least the surface layer section.

7. The piezoelectric device according to claim 1, wherein the underlying layer is composed of at least three layers, a mid layer thereof being made by disposing a metal having an electric resistance value lower than that of the metallic material of adverse wettability.

* * * * *